(12) United States Patent  
Hayashi et al.

(10) Patent No.: US 9,172,053 B2  
(45) Date of Patent: Oct. 27, 2015

(54) ORGANIC MOLECULAR MEMORY AND METHOD OF MANUFACTURING THE SAME

(71) Applicant: KABUSHIKI KAISHA TOSHIBA, Tokyo (JP)

(72) Inventors: Tetsuya Hayashi, Kanagawa (JP); Hideyuki Nishizawa, Tokyo (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/578,618

(22) Filed: Dec. 22, 2014

(65) Prior Publication Data

US 2015/0108421 A1   Apr. 23, 2015

Related U.S. Application Data

(63) Continuation of application No. 14/035,532, filed on Sep. 24, 2013, now Pat. No. 8,975,622, which is a continuation of application No. PCT/JP2011/005274, filed on Sep. 20, 2011.

(30) Foreign Application Priority Data

Mar. 24, 2011   (JP) ................. 2011-065527

(51) Int. Cl.
 *H01L 51/00* (2006.01)
 *H01L 27/24* (2006.01)
 (Continued)

(52) U.S. Cl.
 CPC ........ *H01L 51/0098* (2013.01); *H01L 27/2409* (2013.01); *H01L 27/2436* (2013.01); *H01L 27/2463* (2013.01); *H01L 27/2481* (2013.01);
 (Continued)

(58) Field of Classification Search
 CPC ............ H01L 51/0047; H01L 51/0595; H01L 51/0591; H01L 27/2409; H01L 27/2481
 See application file for complete search history.

(56) References Cited

U.S. PATENT DOCUMENTS 6,852,586 B1   2/2005   Buynoski et al.
7,645,546 B2   1/2010   Yang et al.
(Continued)

FOREIGN PATENT DOCUMENTS

CN   101199021 A   6/2008
EP   1 357 612   10/2003
(Continued)

OTHER PUBLICATIONS

Japanese Office Action issued Jan. 6, 2015 in Patent Application No. 2014-118043 (with English Translation).
(Continued)

*Primary Examiner* — William Coleman
(74) *Attorney, Agent, or Firm* — Oblon, McClelland, Maier & Neustadt, L.L.P.

(57) ABSTRACT

An organic molecular memory for controlling a current flowing through a memory cell and achieving stable operation and high degree of reliability is provided. The organic molecular memory includes a first electrode, a second electrode made of a material different from the first electrode, and an organic molecule layer provided between the first electrode and the second electrode, wherein one end of a resistance change-type molecular chain constituting the organic molecule layer is chemically bonded with the first electrode, and an air gap exists between the other end of the resistance change-type molecular chain and the second electrode.

27 Claims, 19 Drawing Sheets

(51) Int. Cl.
*H01L 45/00* (2006.01)
*H01L 51/05* (2006.01)

(52) U.S. Cl.
CPC ............ *H01L 45/04* (2013.01); *H01L 45/1233* (2013.01); *H01L 45/14* (2013.01); *H01L 51/0591* (2013.01); *H01L 51/0595* (2013.01)

(56) References Cited

U.S. PATENT DOCUMENTS

| | | |
|---|---|---|
| 7,663,141 B2 | 2/2010 | Cho et al. |
| 2004/0109954 A1 | 6/2004 | Ogawa et al. |
| 2004/0149552 A1 | 8/2004 | Moeller et al. |
| 2005/0157535 A1 | 7/2005 | Jackson et al. |
| 2005/0249975 A1 | 11/2005 | Sandberg et al. |
| 2005/0253139 A1 | 11/2005 | Gorman et al. |
| 2007/0045615 A1 | 3/2007 | Cho et al. |
| 2007/0090348 A1 | 4/2007 | McCreery et al. |
| 2008/0094872 A1 | 4/2008 | Lee et al. |
| 2009/0285981 A1 | 11/2009 | Dyreklev et al. |
| 2010/0213435 A1 | 8/2010 | Fujii et al. |
| 2011/0198559 A1 | 8/2011 | Wang et al. |
| 2012/0228576 A1 | 9/2012 | Asakawa et al. |

FOREIGN PATENT DOCUMENTS

| | | |
|---|---|---|
| JP | 6-66511 A | 3/1994 |
| JP | 2005-203793 | 7/2005 |
| JP | 2006-517056 | 7/2006 |
| JP | 2007-527620 | 9/2007 |
| JP | 2007-531265 | 11/2007 |
| JP | 2008-107795 | 5/2008 |
| JP | 2008-544519 | 12/2008 |
| JP | 2010-157769 | 7/2010 |
| JP | 2010-199215 | 9/2010 |

OTHER PUBLICATIONS

International Search Report issued Dec. 27, 2011 in PCT/JP2011/005274 filed Sep. 20, 2011.
"Fabrication approach for molecular memory arrays" by C. Li, et al., Applied Physics Letters, vol. 82, No. 4, Jan. 27, 2003, pp. 645-647.
"Structure-Dependent Charge Transport and Storage in Self-Assembled Monolayers of Compounds of interest in Molecular Electronics: Effects of Tip Material, Headgroup, and Surface Concentration" by F-R. F. Fan, et al., Journal of the American Chemical Society, vol. 126, No. 12, American Chemical Society, 2004, pp. 4035-4042.
"Molecular random access memory cell" by M. A. Reed, et al., Applied Physics Letters, vol. 78, No. 23, Jun. 2001, pp. 3735-3737.
Supplementary European Search Report issued Oct. 13, 2014, in corresponding European Patent Application No. EP 11 86 1580.
Do-Hyun Kim et al., "Characterization of Phenylene-Based Molecular Switches Self-Assembled in Nano Via Holes of an Electronic Test Platform," *Journal of the Korean Physical Society*, vol. 45, No. 2, Aug. 2004 (pp. 470-474). XP-002729205.
M.A. Reed et al., "Prospects for Molecular-Scale Devices," Electron Devices Meeting, 1999 IEDM Technical Digest (Dec. 5, 2009), pp. 227-230. XP-010372034.
C.P. Husband et al., "Logic and Memory with Nanocell Circuits," *IEEE Transactions on Electron Devices*, vol. 50, No. 9, Sep. 2003.
"Electronic transport of molecular systems" by J. Chen and M.A. Reed, et al., Applied Physics, vol. 281, 2002, pp. 127-145.
"Accoutrements of a molecular computer: switches, memory components and alligator clips" by S. M. Dirk, et al., Tetrahedron, vol. 57, 2001, pp. 5109-5121.
Japanese Office Action issued Apr. 8, 2014 in Patent Application No. 2011-065527 with English Translation.
Taiwanese Office Action issued Apr. 2, 2014 in Patent Application No. 100134400 with English Translation.
Combined Office Action and Search Report issued Oct. 16, 2013 in Taiwanese Patent Application No. 100134400 (with English language translation).
Chinese Office Action issued May 14, 2015, in corresponding Chinese Patent Application No. 20118006B300.8 (with English-language Translation).

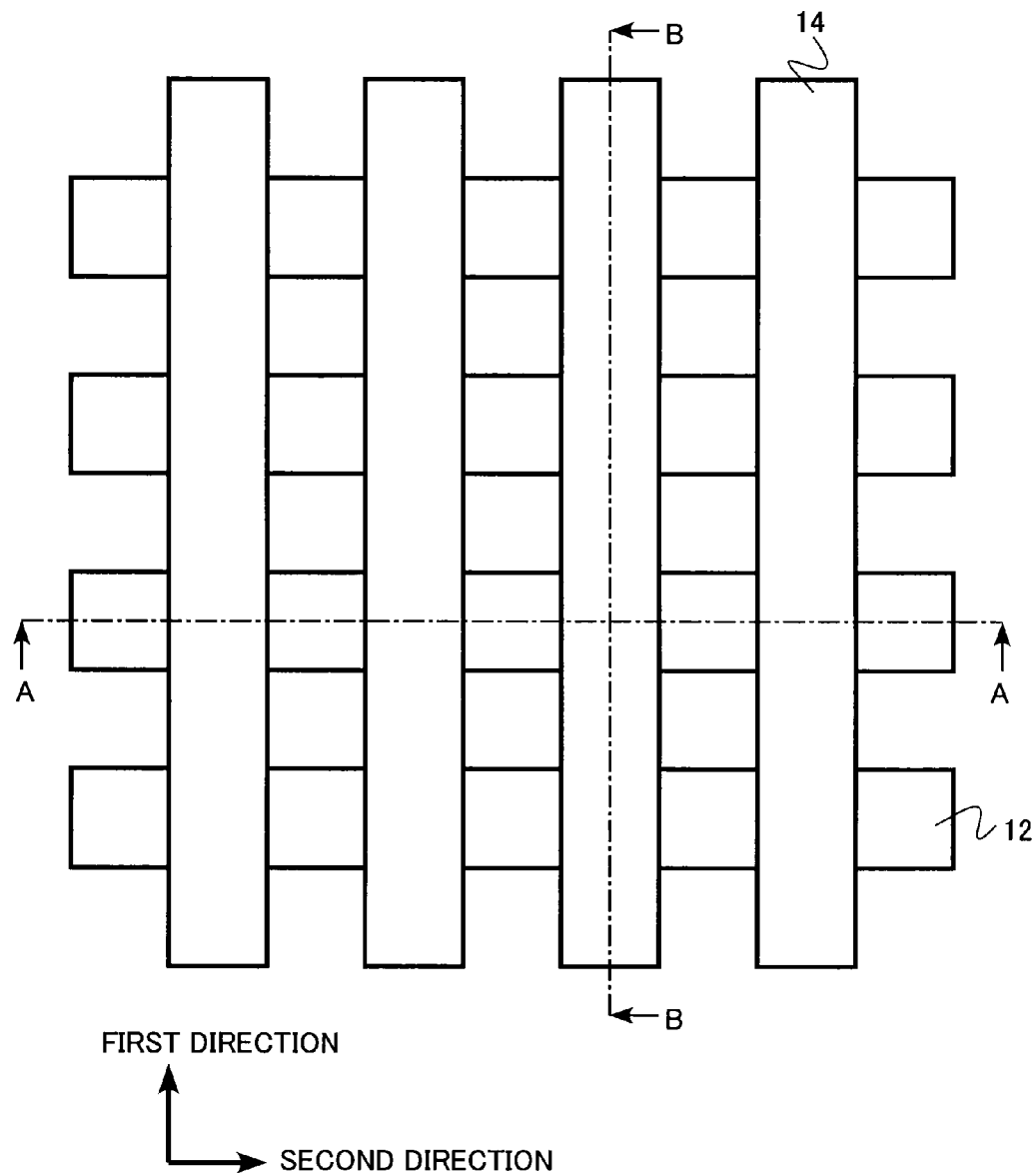

AA CROSS SECTION

BB CROSS SECTION

AA CROSS SECTION

BB CROSS SECTION

AA CROSS SECTION

BB CROSS SECTION

AA CROSS SECTION

BB CROSS SECTION

AA CROSS SECTION

BB CROSS SECTION

AA CROSS SECTION

BB CROSS SECTION

AA CROSS SECTION

BB CROSS SECTION

AA CROSS SECTION

BB CROSS SECTION

AA CROSS SECTION

BB CROSS SECTION

AA CROSS SECTION

BB CROSS SECTION

ORGANIC MOLECULAR MEMORY AND METHOD OF MANUFACTURING THE SAME

CROSS-REFERENCE TO RELATED APPLICATION

This application is continuation application of U.S. Ser. No. 14/035,532, filed Sep. 24, 2013, now allowed; which is a Continuation application of International Application PCT/JP2011/005274, filed Sep. 20, 2011, which claims the benefit of priority from Japanese Patent Application No. 2011-065527, filed on Mar. 24, 2011, the entire contents of all of which are incorporated herein by reference.

FIELD

An embodiment of the present invention relates to an organic molecular memory and a method of manufacturing the same.

BACKGROUND

When organic molecules are used in a memory cell, the size of the memory cell can be reduced since the size of the organic molecule itself is small. Therefore, memory density can be improved. For this reason, an attempt is made to make a memory cell in which upper and lower electrodes are configured to sandwich molecules having function of changing resistance in response to presence/absence of electric field or injection of charge. In this memory cell, the resistance is changed using a voltage applied between the upper and lower electrodes, and the difference of a flowing electric current is detected.

BRIEF DESCRIPTION OF THE DRAWINGS

FIG. 3 is a schematic top view illustrating the organic molecular memory according to the first embodiment.

DETAILED DESCRIPTION

An organic molecular memory according to an embodiment includes a first electrode, a second electrode having a surface facing the first electrode, and the surface being made of a material different from the first electrode, and an organic molecule layer provided between the first electrode and the second electrode, and having a resistance change-type molecular chain wherein one end of the resistance change-type molecular chain is chemically bonded with the first electrode, and an air gap exists between the other end of the resistance change-type molecular chain and the second electrode.

Hereinafter, embodiments will be explained with reference to the drawings.

In this specification, "resistance change-type molecular chain" means a molecular chain having function of changing resistance in response to presence/absence of electric field or injection of charge.

In this specification, "chemical bond" is a concept indicating any one of a covalent bond, an ionic bond, a metallic bond, excluding a concept of a hydrogen bond and bonding with van der Waals' force.

In this specification, "there is an air gap" means "there is no chemical bond therebetween". Further, the "air gap width" means a distance between an electrode and an end portion of a resistance change-type molecular chain constituting an organic molecule layer facing the electrode. More specifically, the "air gap width" means a concept representing a distance between an electrode surface and a center of gravity of carbon (C) atom or a hetero atom such as oxygen (O) atom, nitrogen (N) atom, and sulfur (S) atom at an end portion of the resistance change-type molecular chain. On the other hand, an "air gap" portion may be either vacuum or filled with air or any other gases.

First Embodiment

An organic molecular memory according to the present embodiment includes a first electrode wire, a second electrode wire that crosses the first electrode wire. The second electrode has a surface facing the first electrode and the surface is made of a material different from the first electrode wire. And an organic molecule layer having a resistance change-type molecular chain is provided between the first electrode wire and the second electrode wire, at a crossing portion between the first electrode wire and the second electrode wire. One end of the resistance change-type molecular chain constituting the organic molecule layer is chemically bonded with the first electrode wire, and an air gap exists between the other end thereof and the second electrode wire.

The above configuration reduces an electric current flowing through an organic molecule layer of the organic molecular memory (which may be hereinafter simply referred to as molecular memory). Therefore, this can prevent wires from breaking due to migration caused by flow of excessive current. When the leak current is reduced in an unselected cell, malfunction of the memory can be prevented.

Figure 1:
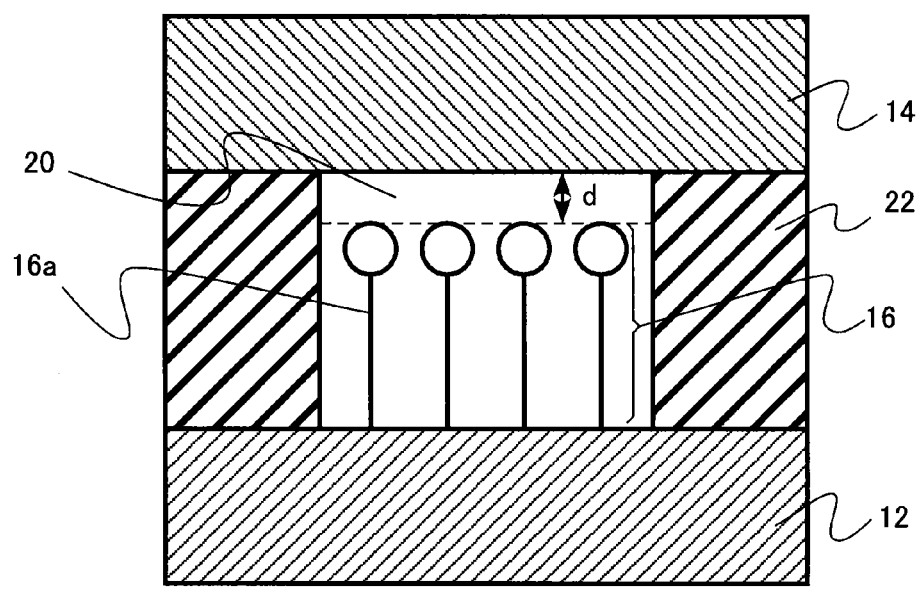
FIG. 1 is a schematic cross sectional view illustrating a memory cell unit of an organic molecular memory according to a first embodiment.
Figure 2:
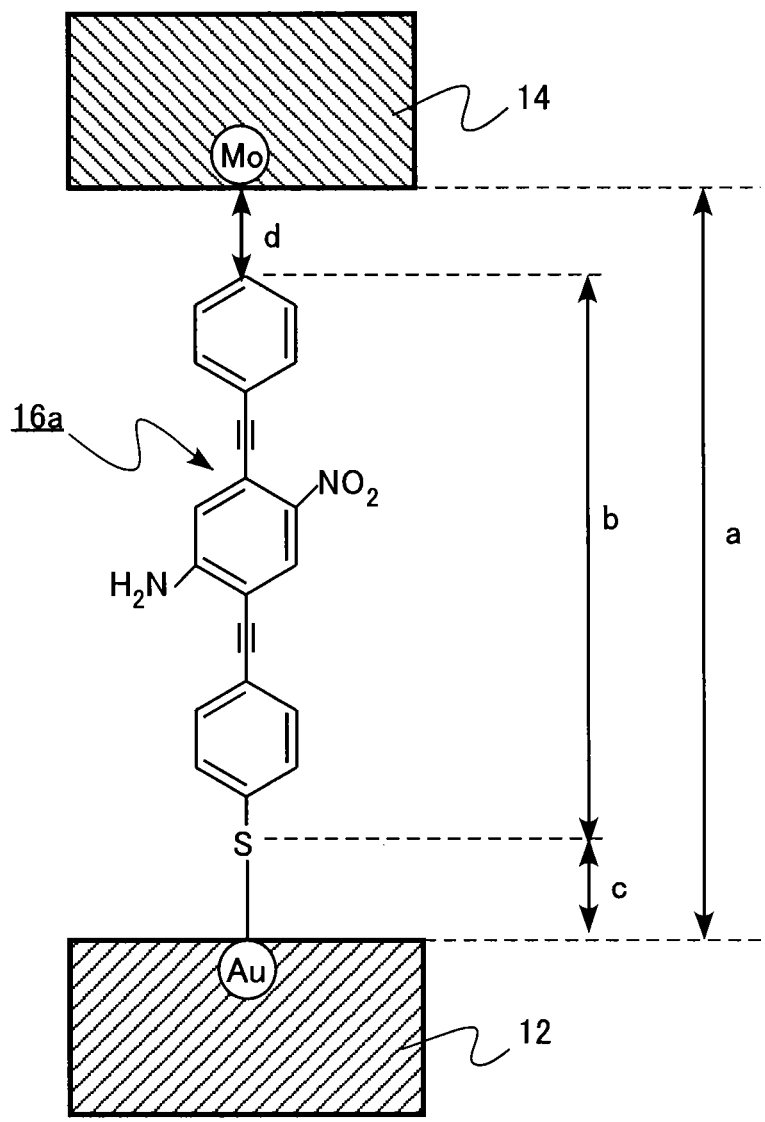
FIG. 2 is a figure illustrating a molecular structure of a resistance change-type molecular chain according to the first embodiment.
Figure 4A:
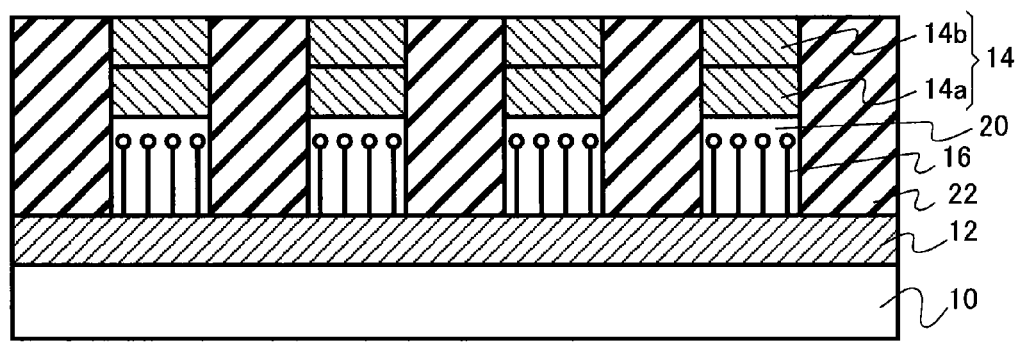
FIGS. 4A and 4B are schematic cross sectional views of FIG. 3.
Figure 4B:
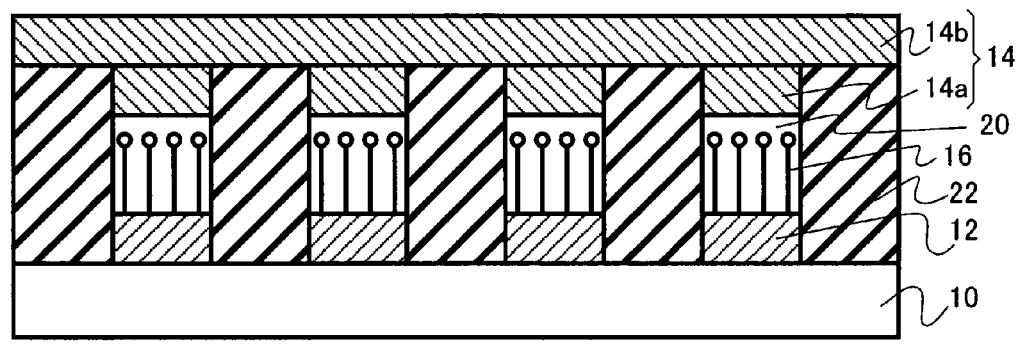

FIG. 3 is a schematic top view illustrating a molecular memory according to the present embodiment. FIGS. 4A and 4B are schematic cross sectional views of FIG. 3. FIG. 4A is a cross sectional view taken along AA of FIG. 3. FIG. 4B is a cross sectional view taken along BB of FIG. 3. FIG. 1 is a partially enlarged view of FIG. 4A. FIG. 1 is a schematic cross sectional view illustrating a memory cell (molecular cell) unit of an organic molecular memory. FIG. 2 is a figure illustrating a molecular structure of a resistance change-type molecular chain.

The molecular memory according to the present embodiment is a cross point-type molecular memory. As shown in FIGS. 3, 4A and 4B, a plurality of lower electrode wires (first electrode wires or first electrodes) 12 are provided on an upper portion of a substrate 10. A plurality of upper electrode wires (second electrode wires or second electrodes) 14 that are made of a material different from the lower electrode wires 12 are provided to cross the lower electrode wires 12. In FIG. 3, the upper electrode wires 14 are perpendicular to the lower electrode wires 12. The design rule of the electrode wires are, for example, about 3 to 20 nm.

The upper electrode wire 14 has a two layer structure including a plug portion 14a and a wire portion 14b.

An organic molecule layer 16 is provided, between the lower electrode wire 12 and the upper electrode wire 14, at a crossing portion between the lower electrode wire 12 and the upper electrode wire 14. The organic molecule layer 16 is constituted by a plurality of resistance change-type molecular chains 16a.

The organic molecule layer 16 and the lower electrode wire 12 are in contact with each other, and an air gap 20 exists between the organic molecule layer 16 and the upper electrode wire 14. More specifically, one end of the resistance change-type molecular chain 16a constituting the organic molecule layer 16 is chemically bonded with the lower electrode wire 12, and the air gap 20 exists between the other end thereof and the upper electrode wire 14. The width of the air gap 20, i.e., air gap width, is the distance indicated by "d" in FIGS. 1, 2. The resistance change-type molecular chain 16a extends substantially perpendicular the surface of the lower electrode wire 12 with which the resistance change-type molecular chain 16a is chemically bonded.

Insulating layers 22 are formed in spaces between adjacent organic molecule layers 16, between lower electrode wires 12, and between upper electrode wires 14.

The substrate 10 is, for example, silicon in which (110) plane is a surface. The lower electrode wire 12 is, for example, gold (Au), i.e., metallic material. The surface of the lower electrode wire 12 in contact with the organic molecule layer is, for example, (111) plane. The upper electrode wire 14 is, for example, molybdenum (Mo), i.e., metallic material. The insulating layer 22 is, for example, a silicon nitride film.

The resistance change-type molecular chain 16a constituting the organic molecule layer 16 is, for example, 4-[2-amino-5-nitro-4-(phenylethynyl)phenylethynyl]benzenethiol as shown in FIG. 2. The resistance change-type molecular chain having a molecular structure as shown in FIG. 2 is also referred to as a tour wire.

The resistance change-type molecular chain 16a is a molecular chain having function of changing resistance in response to presence/absence of electric field and injection of charge. For example, the resistance change-type molecular chain having the molecular structure as shown in FIG. 2 can switch between low resistance state and high resistance state when a voltage is applied between both end portions. The memory cell is achieved using this change of resistance state.

More specifically, in FIG. 2, when a voltage is applied to the upper electrode wire 14, the resistance change-type molecular chain attains low resistance state, i.e., initial state. The polarity of the voltage applied on this occasion is determined according to a structure of a molecule, a bonding angle of the molecule and the electrode, and Fermi level of the electrode. For example, this is defined as "0" state. On the other hand, when a voltage having a polarity opposite to that of attaining "0" state is applied to the upper electrode wire 14, the resistance change-type molecular chain is ionized and attains high resistance state. For example, this is defined as "1" state. The memory cell functions by writing, reading, erasing this "0" state and the "1" state.

In the present embodiment, as shown in FIG. 1, one end of the resistance change-type molecular chain 16a constituting the organic molecule layer 16 is chemically bonded with the lower electrode wire 12. On the other hand, the other end of the resistance change-type molecular chain 16a is not chemically bonded with the upper electrode wire 14, and the air gap having the air gap width d exists therebetween.

In a case of the resistance change-type molecular chain 16a of FIG. 2, thiol group exists at one end, and the sulfur atom (S) and gold atom (Au) on the surface of the lower electrode wire 12 are chemically bonded. On the other hand, the benzene ring at the other end of the resistance change-type molecular chain 16a is chemically bonded with the molybdenum (Mo) atom on the surface of the upper electrode wire 14, and the air gap having the air gap width d exists therebetween.

Since the air gap exists, the air gap serves as a barrier against the electric current when the electric current is passed by applying the voltage between both end portions of the resistance change-type molecular chain 16a. Therefore, the current flowing through the resistance change-type molecular chain 16a can be reduced by the air gap whose width is d. Further, by controlling the air gap width d, the probability of charge tunneling through the barrier can be controlled. Therefore, by changing the air gap width d, the current value can also be set to a desired value.

Figure 5:
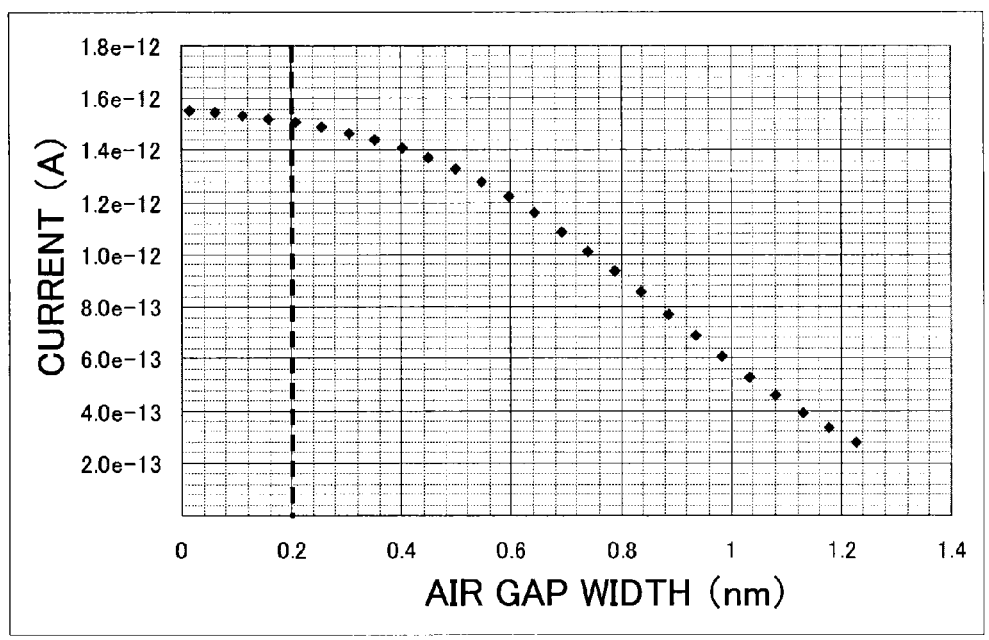
FIG. 5 is a simulation result of relationship between a current flowing through a resistance change-type molecular chain and an air gap width according to the first embodiment.

FIG. 5 is a simulation result of relationship between a current flowing through a resistance change-type molecular chain and an air gap width. The resistance change-type molecular chain has the structure as shown in FIG. 2.

In this case, it is assumed 1 V is applied to the electrode at the air gap side (upper electrode wire 14 of FIG. 2), and 0 V is applied to the counter electrode (lower electrode wire 12 of FIG. 2). The temperature is 300 K.

In the simulation, the tunneling rate of the air gap is a parameter. In the FIG. 5, the tunneling rate is converted into the air gap width. The conversion uses relation between the air gap width and the tunneling rate attained by other calculations, i.e., the fact that change of air gap width of 1 nm corresponds to double-digit change of tunneling rate, is used. A state in which the current is saturated with respect to the tunneling rate, i.e., a state in which the resistance change-type molecular chain can be assumed to be chemically bonded with or in contact with the electrode, is defined as an air gap width of 0 nm.

As shown in FIG. 5, when the air gap width exceeds 0.2 nm, the electric current begins to decrease, and when the air gap width exceeds 0.5 nm, the electric current significantly decreases. Therefore, in view of efficiently obtaining current reduction effect, 0.2 nm or more width of the air gap is preferable, and 0.5 nm or more width of it is more preferable.

On the other hand, when the air gap width increases, the voltage between the electrodes required to perform writing/erasing in the molecular chain increases. In a typical case, it is necessary to apply a voltage of 1 V or more to the molecular chain in order to perform writing/erasing. For example, when the relative permittivity of the organic molecule layer is about 3 and the air gap is 54 nm, it is necessary to apply 10 V to the electrode.

The voltage applied between the electrodes is preferably less than 10 V in order to ensure operation and reliability as the memory cell. Therefore, the air gap width is desirably 50 nm or less.

In the actual memory cell, the air gap width d can be calculated as follows, for example. First, the distance between the electrodes (a in FIG. 2) can be obtained by observation using TEM (Transmission Electron Microscope). On the other hand, the length of the resistance change-type molecular chain (b in FIG. 2) is calculated by analyzing the structure of the molecules in the organic molecule layer and identifying the molecular structure. Strictly speaking, the length of the resistance change-type molecular chain is a distance between the centers of gravities of atoms other than hydrogen (in FIG. 2, sulfur and carbon) at the end portions of the resistance change-type molecular chain.

The chemical bonding distance between the electrode and the resistance change-type molecular chain (c in FIG. 2) can be determined from values disclosed in known documents when the type of atom located at the end portion (in FIG. 2, sulfur) that can be found from the molecular structure and the type of atom of the electrode surface (in FIG. 2, gold) that can be bonded with this atom are determined.

Therefore, the air gap width d can be calculated from the following (formula 1).

$$d=a-(b+c) \quad \text{(formula 1)}$$

The relationship between the air gap width and the electric current as shown in FIG. 5 is basically considered to have the same tendency even when the structure of the resistance change-type molecular chain 16a is changed. This is because the relationship between the air gap width and the electric current mainly depends on the tunneling rate of the air gap serving as the barrier, and the tunneling rate basically does not dependent on the structure of the resistance change-type molecular chain.

Further, whether the end portion of the resistance change-type molecular chain 16a is chemically bonded with the lower electrode or not is determined by, for example, whether the resistance change-type molecular chain 16a is formed in self-assembled manner with respect to the electrode material or not. This can be checked by observing the upper surface of the organic molecule layer using scanning tunneling microscope (STM). On the other hand, when the air gap width is determined to be at least 0.2 nm or more, the end portion of the resistance change-type molecular chain 16a is deemed not to be chemically bonded with the upper electrode.

Hereinabove, 4-[2-amino-5-nitro-4-(phenylethynyl)phenylethynyl]benzenethiol as shown in FIG. 2 is an example of the resistance change-type molecular chain 16a. However, the resistance change-type molecular chain 16a is not limited to the molecular chain of FIG. 2 as long as it is a molecular chain having function of changing resistance.

For example, it may be derivative of 4-[2-amino-5-nitro-4-(phenylethynyl)phenylethynyl]benzenethiol indicated below (general formula 1).

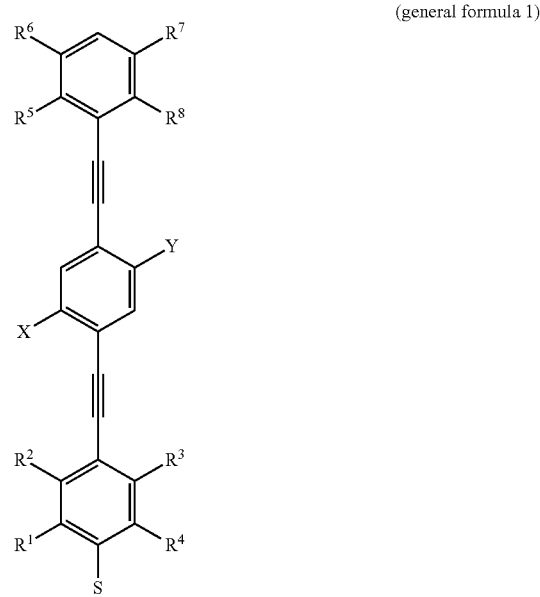

(general formula 1)

(In the above general formula 1, the combination of X and Y is any two of fluorine (F), chlorine (Cl), bromine (Br), iodine (I), cyano group (CN), nitro group ($NO_2$), amino group (NH2), hydroxyl group (OH), carbonyl group (CO), and carboxyl group (COOH). On the other hand, $R_n$ (n=1 to 8) denotes any one of atoms and characteristic groups (for example, hydrogen (H), fluorine (F), chlorine (Cl), bromine (Br), iodine (I), methyl group ($CH_3$)) except atoms whose outermost electron is d electron/f electron.

Alternatively, the resistance change-type molecular chain 16a may be molecules in which pi-conjugated system extends in one-dimensional direction other than the molecular structure represented by the general formula 1. For example, paraphenylene derivative, oligothiophene derivative, oligo pyrrole derivatives, oligo furan derivatives, and paraphenylenevinylene derivatives can be used.

Figure 6A:
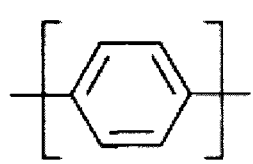
FIGS. 6A to 6F are figures illustrating examples of molecular units capable of constituting a molecule in which pi-conjugated system extends in one-dimensional direction.
Figure 6B:
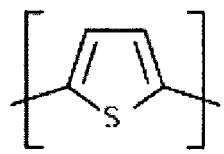
Figure 6C:
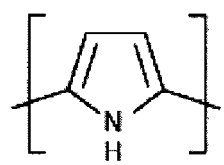
Figure 6D:
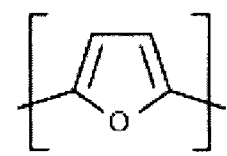
Figure 6E:
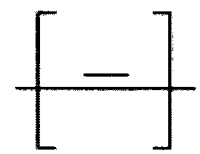
Figure 6F:
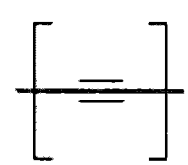

FIGS. 6A to 6F shows examples of molecular units capable of constituting a molecule in which pi-conjugated system extends in one-dimensional direction. FIG. 6A is paraphenylene. FIG. 6B is thiophene. FIG. 6C is pyrrole. FIG. 6D is furan. FIG. 6E is vinylene. FIG. 6F is alkyne. Alternatively, a 6-membered heterocyclic compound such as pyridine may be used.

When the length of the pi-conjugated system is short, the electrons injected from the electrode might pass through the electrodes without staying in the molecules. Therefore, a molecule having a certain length for storing charge is desired. The resistance change-type molecular chain 16a is desired to have five units of —CH═CH— or more in one-dimensional direction. This length corresponds to three benzene rings (paraphenylene) or more.

When the length of the pi-conjugated system is long, the voltage drops due to conduction of charge in a molecule might occur. Therefore, the resistance change-type molecular chain 16a is desired to have 20 units of —CH═CH— or less in one-dimensional direction. 20 units of —CH═CH— is equivalent to twice 10 benzene rings, and equivalent to twice the extending width of polaron as carrier of pi-conjugated system.

The resistance change-type molecular chain 16a as shown in FIG. 2 has asymmetric voltage-current characteristic, i.e., a diode characteristic. The resistance change-type molecular chain 16a desirably has diode characteristic in order to reduce a leak current in an unselected cell.

For example, gold is the material of the lower electrode wire 12, and molybdenum is the material of the upper electrode wire 14 in the above explanation. However, the materials of the lower electrode wire 12 and the upper electrode wire 14 are not limited thereto.

At least in the region where the resistance change-type molecular chain 16a is chemically bonded, the electrode chemically bonded with one end of the resistance change-type molecular chain 16a (in the present embodiment, the lower electrode wire 12) is desirably made of a material that easily allows chemical bonding with the one end of the resistance change-type molecular chain 16a. At least in the region facing the resistance change-type molecular chain 16a, the electrode at the air gap (in the present embodiment, upper electrode wire 14) is desirably made of a material that does not easily allow chemical bonding with the one end of the resistance change-type molecular chain 16a due to a manufacturing method explained later.

Desirable materials are different according to the structure of the one end of the resistance change-type molecular chain 16a. For example, when the one end is thiol group as shown in FIG. 2, the chemically bonding electrode is desirably gold (Au), silver (Ag), copper (Cu), tungsten (W), tungsten nitride (WN), tantalum nitride (TaN), or titanium nitride (TiN), and among them, gold(Au), silver (Ag), or tungsten (W) which can easily make chemical bonding is particularly desirable. On the other hand, the electrode at the air gap side is desirably tantalum (Ta), molybdenum (Mo), molybdenum nitride (MoN), or silicon (Si).

For example, when the one end is alcohol group or carboxyl group, the chemically bonding electrode is desirably tungsten (W), tungsten nitride (WN), tantalum (Ta), tantalum nitride (TaN), molybdenum (Mo), molybdenum nitride (MoN), or titanium nitride (TiN), and among them, tantalum (Ta), tantalum nitride (TaN), molybdenum nitride (MoN), or titanium nitride (TiN) which can easily make chemical bonding is particularly desirable. On the other hand, the electrode at the air gap side is desirably gold(Au), silver (Ag), copper (Cu), or silicon (Si).

For example, when the one end is silanol group, the chemically bonding electrode is desirably silicon (Si) or metal oxide. On the other hand, the electrode at the air gap is desirably gold(Au), silver (Ag), copper (Cu), tungsten (W), tungsten nitride (WN), tantalum (Ta), tantalum nitride (TaN), molybdenum (Mo), molybdenum nitride (MoN), or titanium nitride (TiN).

When the electrode material is chemical compound, the composition of the chemical compound can be selected as necessary.

For example, graphene and carbon nanotube can be applied as electrode materials.

In the above explanation, for example, silicon is used as the substrate 10. However, the material of the substrate 10 is not limited thereto. An appropriate material may be selected as necessary from semiconductor materials, insulating materials, and the like in view of orientation of the electrode material formed on the substrate 10, consistency in the process, and the like.

Further, the material of the insulating layer 22 is not limited to the silicon nitride film, and can be selected as necessary from the other insulating materials.

FIGS. 7A to 15B are schematic cross sectional views illustrating a method of manufacturing the organic molecular memory according to the present embodiment as shown in FIGS. 1, 3, and 4. FIGS. 7A to 15A are figures corresponding to cross section AA of FIG. 3. FIGS. 7B to 15B are figures corresponding to cross section BB of FIG. 3. Hereinafter, the manufacturing method according to the present embodiment will be explained with reference to FIGS. 7A to 15B.

Figure 7A:
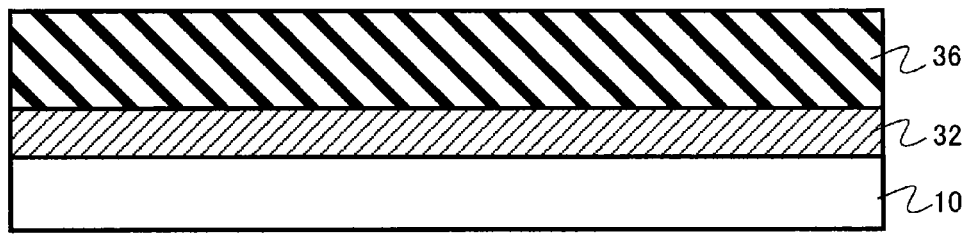
FIGS. 7A and 7B are schematic cross sectional views illustrating a method of manufacturing the organic molecular memory according to the first embodiment.
Figure 7B:
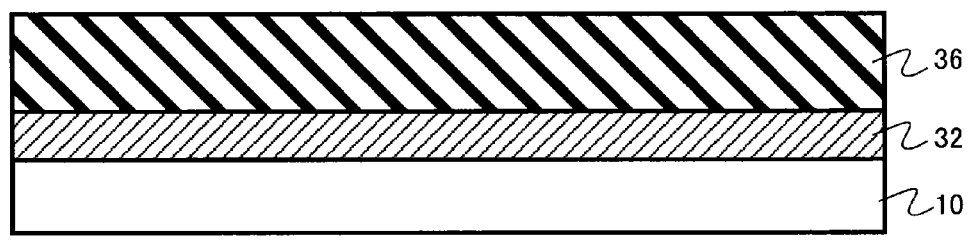

First, a gold layer 32, serving as the first electrode material, is formed by, e.g., evaporation, on the substrate 10 made of silicon of (110) plane. In this case, the surface of the gold layer 32 is (111) plane. Further, on the gold layer 32, a sacrifice layer 36 made of, e.g., a silicon oxide film is formed (FIGS. 7A, 7B). On this occasion, the sacrifice layer 36 is formed to have enough thickness to form the air gap between the resistance change-type molecular chain and the upper electrode wire later. In other words, the thickness is set thicker than the length of the resistance change-type molecular chain.

Figure 8A:
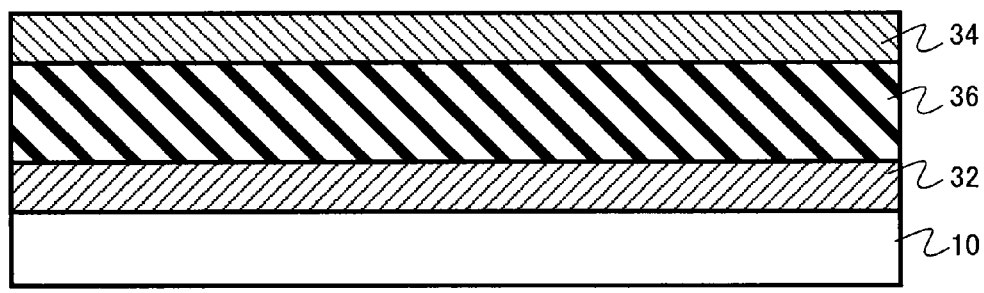
FIGS. 8A and 8B are schematic cross sectional views illustrating the method of manufacturing the organic molecular memory according to the first embodiment.
Figure 8B:
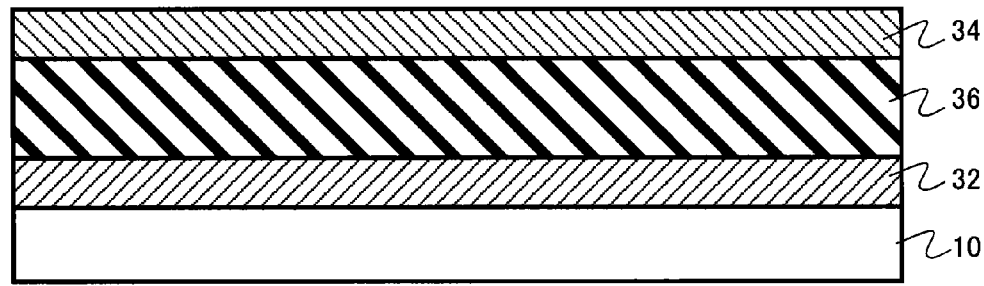

Subsequently, a molybdenum layer 34 serving as the second electrode material is formed on the sacrifice layer 36 by, e.g., evaporation (FIGS. 8A, 8B). On this occasion, the second electrode material is formed with a material different from the first electrode material.

On this occasion, at least the surface of the first electrode material is selected from a material that easily allows chemical bonding with the resistance change-type molecular chain of the organic molecule layer formed later. On the other hand, at least the surface of the second electrode material is selected from a material that does not easily allow chemical bonding with the resistance change-type molecular chain of the organic molecule layer formed later.

Figure 9A:
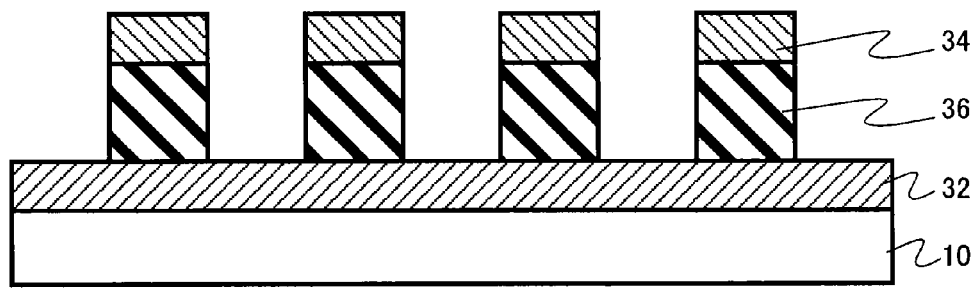
FIGS. 9A and 9B are schematic cross sectional views illustrating the method of manufacturing the organic molecular memory according to the first embodiment.
Figure 9B:
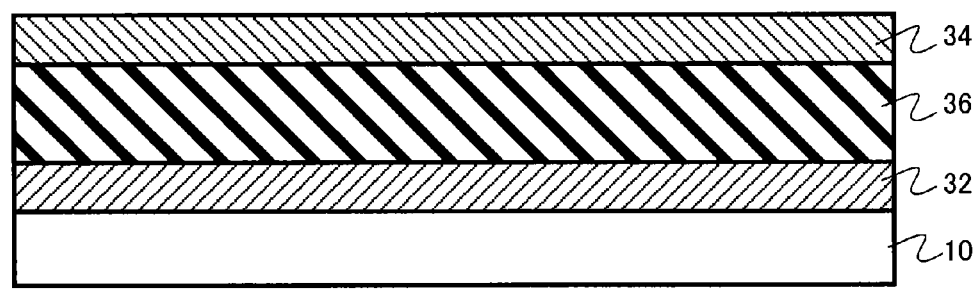

Subsequently, the molybdenum layer 34 and the sacrifice layer 36 are patterned using known lithography technique and etching technique, and are made into a plurality of lines extending in the first direction (see FIG. 3, FIGS. 9A and 9B).

Figure 10A:
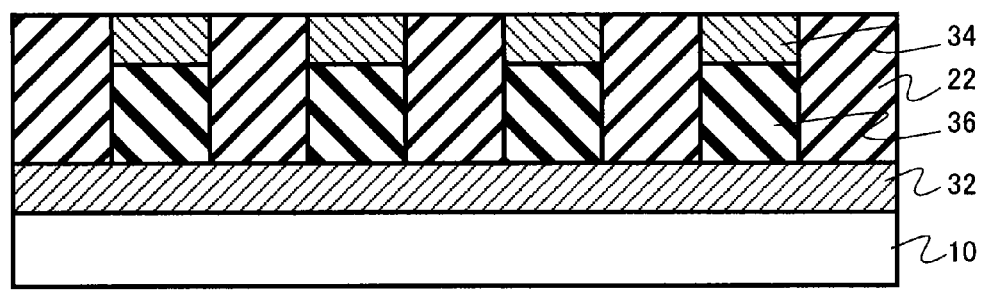
FIGS. 10A and 10B are a schematic cross sectional view illustrating the method of manufacturing the organic molecular memory according to the first embodiment.
Figure 10B:
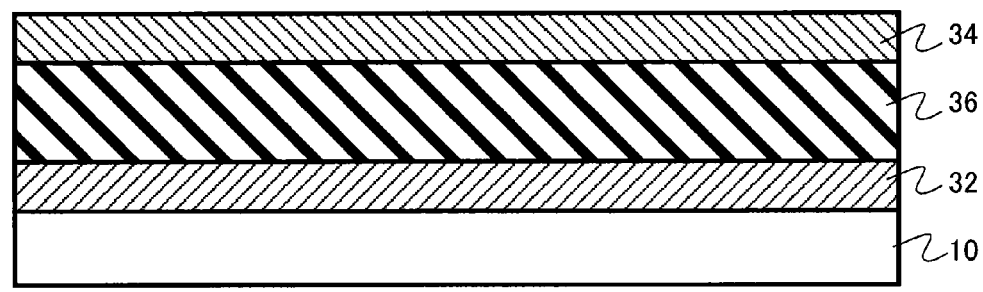

Subsequently, space between the patterned molybdenum layers 34 and the patterned sacrifice layers 36 are filled with, e.g., silicon nitride films, i.e., insulating films, to make a flat surface, whereby insulating layers 22 are formed (FIGS. 10A and 10B).

Figure 11A:
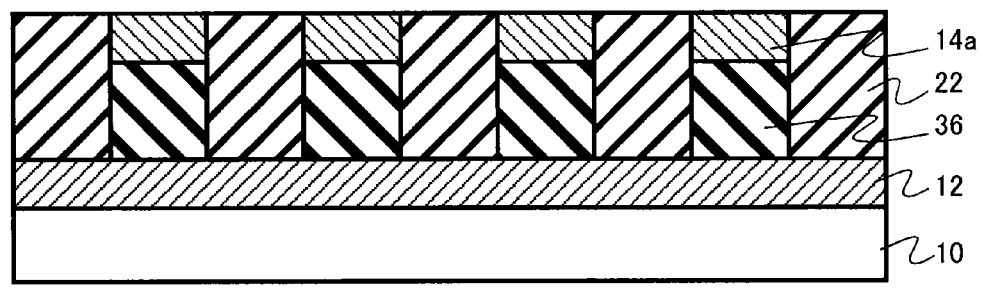
FIGS. 11A and 11B are schematic cross sectional views illustrating the method of manufacturing the organic molecular memory according to the first embodiment.
Figure 11B:
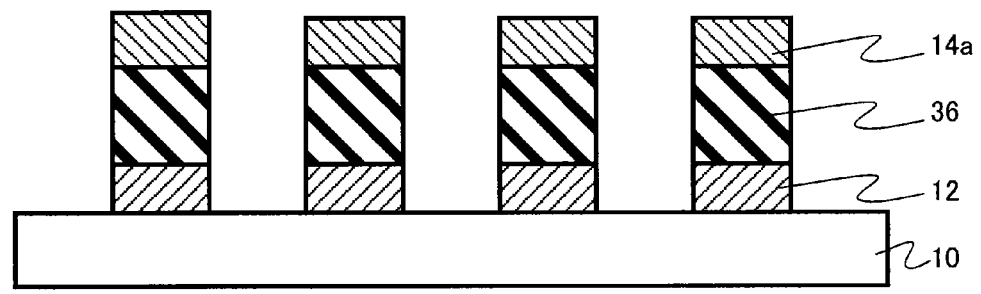

Subsequently, the molybdenum layer 34, the sacrifice layer 36, the insulating layer 22, and the gold layer 32 are patterned using known lithography technique and etching technique. On this occasion, the gold layer 32 is processed into a plurality of lines extending in the second direction (see FIG. 3) crossing the first direction (in the figure, perpendicular to the first direction) to be made into lower electrode wires 12. On the other hand, the molybdenum layer 34 and the sacrifice layer 36 are processed into pillar-shape. The processed molybdenum layer 34 serves as the plug portion 14a of the upper electrode wire 14 (FIGS. 11A and 11B).

Figure 12A:
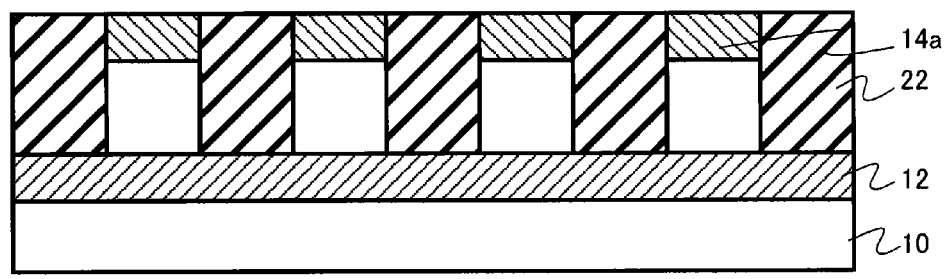
FIGS. 12A and 12B are schematic cross sectional views illustrating the method of manufacturing the organic molecular memory according to the first embodiment.
Figure 12B:
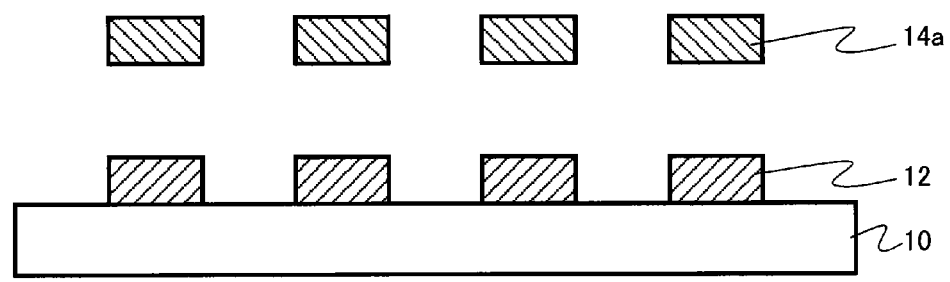

Subsequently, the sacrifice layer 36 is removed by a known wet etching technique (FIGS. 12A and 12B).

Subsequently, the resistance change-type molecular chains having a length shorter than the thickness of the sacrifice layer 36, i.e., the distance between the lower electrode wire 12 and the plug portion 14a, are selectively, chemically bonded with the gold layer 32, whereby the organic molecule layers 16 are formed. For example, a solution is prepared, in which the resistance change-type molecular chains 16a having the structure as shown in FIG. 2 are dispersed in, e.g., ethanol. This, the structure formed on the substrate 10 is immersed in the solution. Thereafter, the structure is rinsed and dried.

Figure 13A:
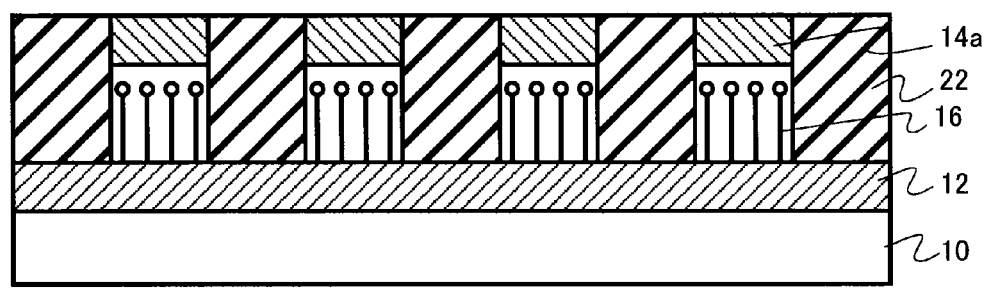
FIGS. 13A and 13B are schematic cross sectional views illustrating the method of manufacturing the organic molecular memory according to the first embodiment.
Figure 13B:
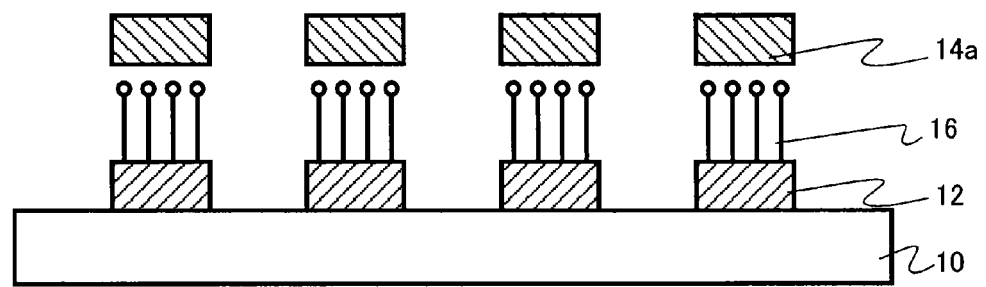

On this occasion, the thiol group of the resistance change-type molecular chain 16a is selectively, chemically bonded with the lower electrode wire 12 made of gold rather than the plug portion 14a made of molybdenum. Therefore, as a result of this process, the organic molecule layers 16, i.e., self-assembled monolayers (SAM), are formed (FIGS. 13A and 13B).

Figure 14A:
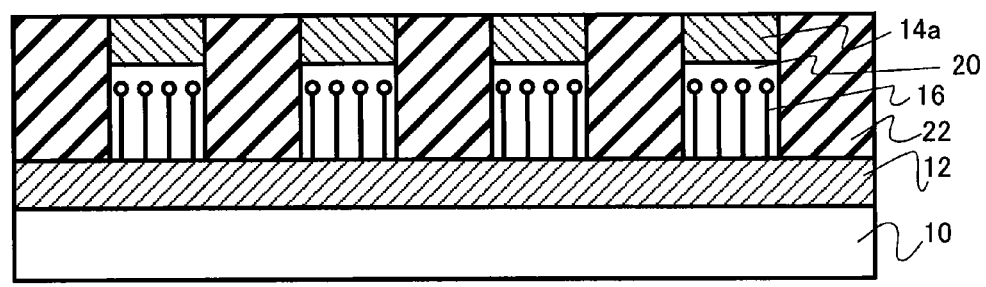
FIGS. 14A and 14B are schematic cross sectional views illustrating the method of manufacturing the organic molecular memory according to the first embodiment.
Figure 14B:
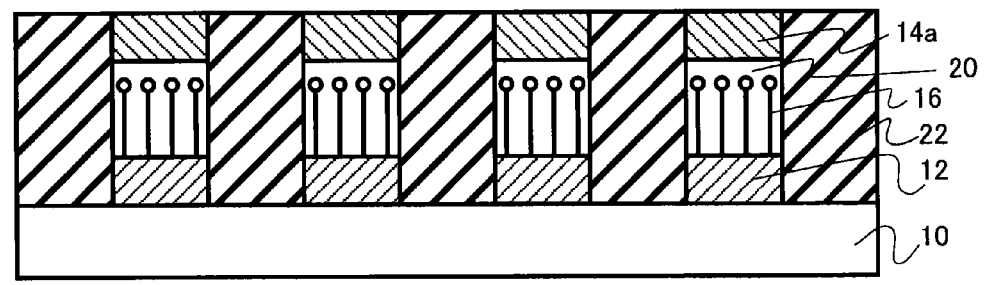

Subsequently, the space between the lower electrode wires 12, between the organic molecule layers 16, and between the upper electrode wires 14 are filled with, e.g., silicon nitride films, i.e., insulating films, to make a flat surface, whereby insulating layers 22 are formed (FIG. 14B).

Figure 15A:
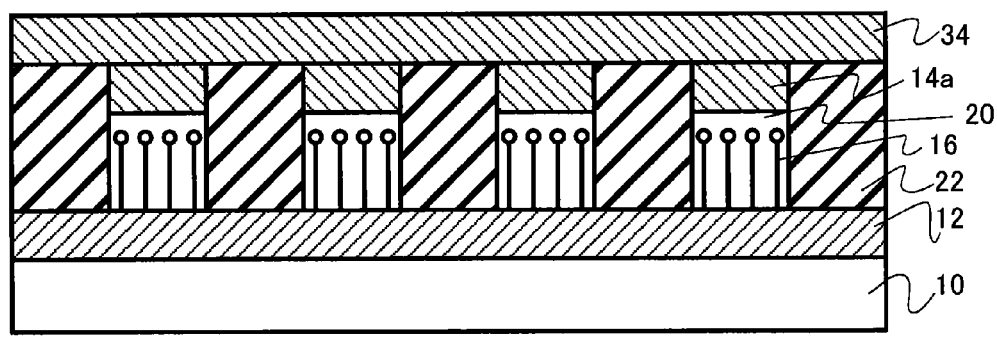
FIGS. 15A and 15B are schematic cross sectional views illustrating the method of manufacturing the organic molecular memory according to the first embodiment.
Figure 15B:
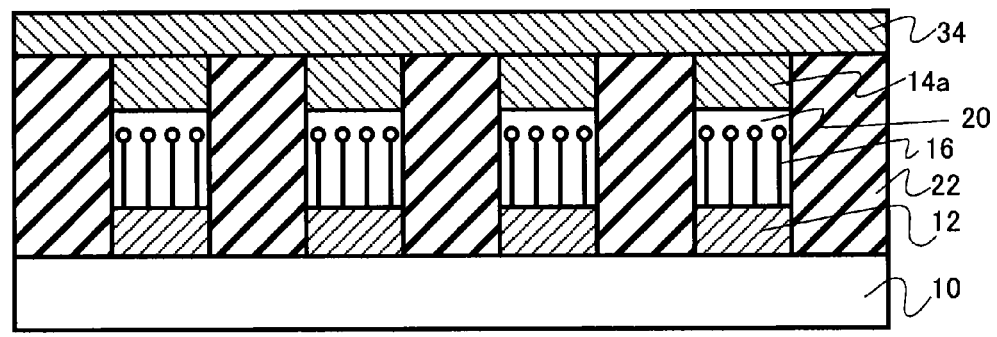

Subsequently, the molybdenum layer 34 serving as the third electrode material is again formed on the plug portion 14a, i.e., the second electrode material (FIGS. 15A and 15B). Thereafter, using known lithography technique and etching technique, the molybdenum layer 34 is patterned into a plurality of lines extending in the first direction and connected with the plug portions 14a, so that the wire portions 14b of the upper electrode wires 14 are formed. Thereafter, the space between wire portions 14b are filled with, e.g., silicon nitride films, and make the surface flat. Thus, the organic molecular memory according to the present embodiment as shown in FIGS. 3, 4, is manufactured.

It should be noted that the materials of the resistance change-type molecular chains, each electrode, and the like may be selected as necessary from among the above candidates and the like in accordance with the molecular memory to be manufactured.

In the organic molecular memory according to the present embodiment, the current flowing through the resistance change-type molecular chain 16a can be reduced by the air gap whose width is d as described above. Therefore, this can prevent wires from breaking due to migration caused by flow of excessive current. When the leak current is reduced in an unselected cell, malfunction of the memory can be prevented.

In addition, by changing the air gap width d, the current flowing through a memory cell can also be set to a desired value. Therefore, the amount of current flowing through the memory cell can be set to an appropriate value in view of memory operation and reliability, and further, the molecular memory stably operating with high degree of reliability can be achieved.

In the manufacturing method according to the present embodiment, the upper and lower electrode wires made of the different materials are formed before the organic molecule layers are formed. On this occasion, by controlling the thickness of the sacrifice layer in accordance with the length of the resistance change-type molecular chain, the air gap width can be constant with high degree of accuracy.

Further, unlike the process in which the upper electrode wires are formed after organic molecule layers are formed, a problem of short-circuit caused by the electrode material entering into the organic molecule layer does not occur. In addition, this can avoid damage applied to the organic molecule layer during the thermal step for forming the upper electrode wires.

Therefore, according to the manufacturing method of the present embodiment, the molecular memory stably operating with high degree of reliability can be manufactured easily.

Second Embodiment

An organic molecular memory according to the present embodiment is different from the first embodiment in that a cell array of an organic molecular memory has a stacked structure. Resistance change-type molecular chains, electrode materials, a material of a substrate, and the like constituting the organic molecule layer are the same as those of the first embodiment. Therefore, descriptions about the same contents as the first embodiment are omitted.

The organic molecular memory according to the present embodiment includes a first electrode wire and a second electrode wire that crosses the first electrode wire and is made of a material different from the first electrode wire. In addition, the organic molecular memory according to the present embodiment includes a first organic molecule layer provided, between the first electrode wire and the second electrode wire, at a crossing portion between the first electrode wire and the second electrode wire, wherein one end of the resistance change-type molecular chain constituting the first organic molecule layer is chemically bonded with the first electrode wire, and an air gap exists between the other end of the resistance change-type molecular chain and the second electrode wire. In addition, the organic molecular memory according to the present embodiment includes a third electrode wire crossing the second electrode wire, wherein the third electrode wire is made of a material different from the second electrode wire. In addition, the organic molecular memory according to the present embodiment includes a second organic molecule layer provided, between the second electrode wire and the third electrode wire, at a crossing portion between the second electrode wire and the third electrode wire, wherein one end of the resistance change-type molecular chain constituting the second organic molecule layer is chemically bonded with the third electrode wire, and an air gap exists between the other end of the resistance change-type molecular chain and the second electrode wire.

Figure 16A:
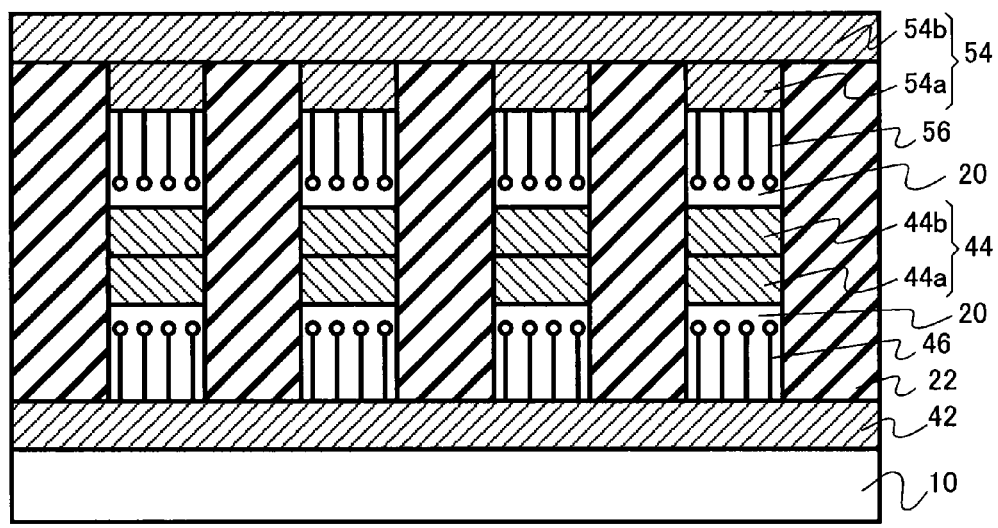
FIGS. 16A and 16B are schematic cross sectional views illustrating the method of manufacturing the organic molecular memory according to a second embodiment.
Figure 16B:
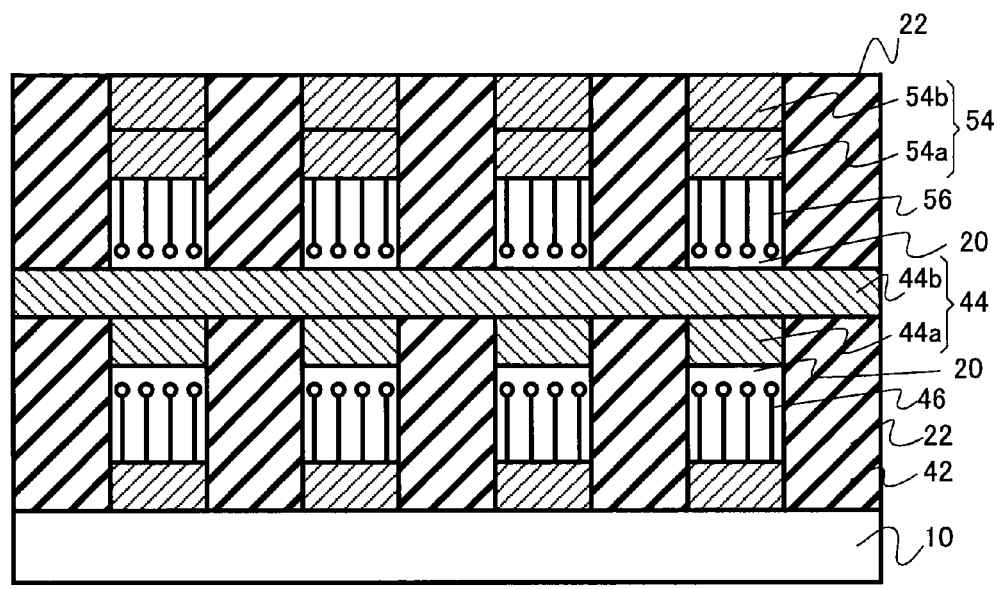

FIGS. 16A and 16B are schematic cross sectional views illustrating the molecular memory according to the present embodiment. FIG. 16B is a figure corresponding to a direction perpendicular to FIG. 16A.

The molecular memory according to the present embodiment is a cross point-type molecular memory in which two layers of cell arrays are stacked. As shown in FIGS. 16A and 16B, a plurality of first electrode wires 42 are provided on an upper portion of a substrate 10. A plurality of second electrode wires 44 that are made of a material different from the first electrode wires 42 are provided to cross the first electrode wires 42. In this case, the second electrode wires 44 are provided perpendicular to the first electrode wires 42.

The second electrode wire 44 has a two layer structure including a plug portion 44a and a wire portion 44b.

A first organic molecule layer 46 is provided, between the first electrode wire 42 and the second electrode wire 44, at a crossing portion between the first electrode wire 42 and the second electrode wire 44. The first organic molecule layer 46 is constituted by a plurality of resistance change-type molecular chains 16a. The plurality of first organic molecule layers 46 constitutes the first memory cell array.

The first organic molecule layer 46 and the first electrode wire 42 are in contact with each other, and an air gap 20 exists between the first organic molecule layer 46 and the second electrode wire 44.

Insulating layers 22 are formed in spaces between adjacent first organic molecule layers 46, between first electrode wires 42, and between second electrode wires 44.

Further, a third electrode wire 54 is provided that crosses the second electrode wire 44 and is made of the same material as the first electrode wire 42 which is different from the second electrode wire 44. The third electrode wire 54 has a two layer structure including a plug portion 54a and a wire portion 54b.

A second organic molecule layer 56 is provided, between the second electrode wire 44 and the third electrode wire 54, at a crossing portion between the second electrode wire 44 and the third electrode wire 54. The plurality of resistance change-type molecular chains 16a constitute the second organic molecule layer 56. The plurality of second organic molecule layers 56 constitute the second memory cell array.

The second organic molecule layer 56 and the third electrode wire 54 are in contact with each other, and an air gap 20 exists between the second organic molecule layer 56 and the second electrode wire 44.

Insulating layers 22 are formed in spaces between adjacent second organic molecule layers 56 and between third electrode wires 54.

The organic molecular memory according to the present embodiment can be manufactured by repeating the manufacturing method of the first embodiment by changing direction of patterning of lines.

According to the present embodiment, two layers of cell arrays are stacked, so that the memory capacity of the molecular memory can be increased. In this explanation, for example, two layers of cell arrays are stacked. However, the memory capacity can be further increased by laminating three layers of cell arrays or more.

Third Embodiment

An organic molecular memory according to the present embodiment is different from the first embodiment in that a cell array of an organic molecular memory has a stacked structure. In addition, the organic molecular memory according to the present embodiment is different from the second embodiment in that resistance change-type molecular chains constituting the first organic molecule layer and the second organic molecule layer are in the same direction. Resistance change-type molecular chains constituting the organic molecule layer, electrode materials, a material of a substrate, and the like are the same as those of the first embodiment. Therefore, description about the same contents as the first embodiment are omitted.

The organic molecular memory according to the present embodiment includes a first electrode wire and a second electrode wire that crosses the first electrode wire, wherein a first surface of the second electrode wire at the first electrode wire side is made of a material different from the first electrode wire, and a second surface of the second electrode wire at the opposite side to the first electrode wire is made of the same material as the first electrode wire. In addition, the organic molecular memory according to the present embodiment includes a first organic molecule layer provided, between the first electrode wire and the second electrode wire, at a crossing portion between the first electrode wire and the second electrode wire, wherein one end of the resistance change-type molecular chain constituting the first organic molecule layer is chemically bonded with the first electrode wire, and an air gap exists between the other end of the resistance change-type molecular chain and the second electrode wire. In addition, the organic molecular memory according to the present embodiment includes a third electrode wire crossing the second electrode wire, wherein a surface of the third electrode wire at the second electrode wire side is made of a material different from the second surface of the second electrode. In addition, the organic molecular memory according to the present embodiment includes a second organic molecule layer provided, between the second electrode wire and the third electrode wire, at a crossing portion between the second electrode wire and the third electrode wire, wherein one end of the resistance change-type molecular chain constituting the second organic molecule layer is chemically bonded with the second electrode wire, and an air gap exists between the other end of the resistance change-type molecular chain and the third electrode wire.

Figure 17A:
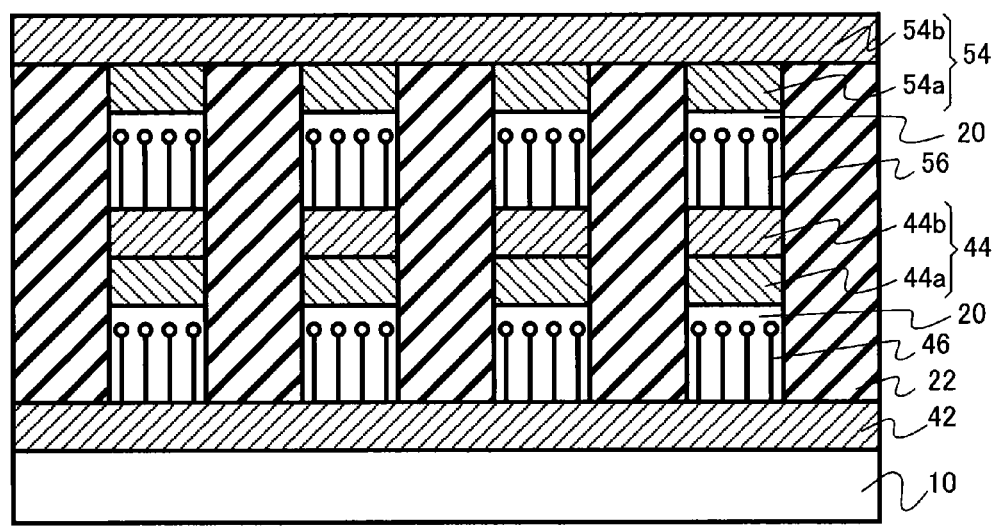
FIGS. 17A and 17B are schematic cross sectional views illustrating an organic molecular memory according to a third embodiment.
Figure 17B:
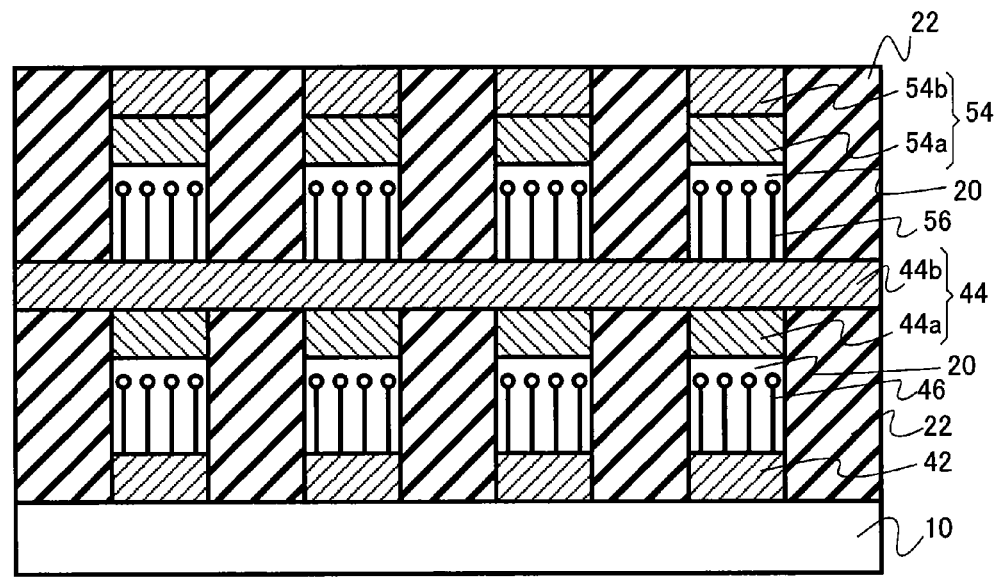

FIGS. 17A and 17B are a schematic cross sectional view illustrating the molecular memory according to the present embodiment. FIG. 17B is a figure corresponding to a direction perpendicular to FIG. 17A.

Like the second embodiment, the molecular memory according to the present embodiment is a cross point-type molecular memory in which two layers of cell arrays are stacked. As shown in FIGS. 17A and 17B, a plurality of first electrode wires 42 are provided on an upper portion of a substrate 10. A plurality of second electrode wires 44 are provided to cross the first electrode wires 42. In this case, the second electrode wires 44 are provided perpendicular to the first electrode wires 42. A first surface of the second electrode wire 44 at the first electrode wire 42 side is made of a material different from the first electrode wire 42, and a second surface of the second electrode wire 44 at the opposite side to the first electrode wire 42 is made of the same material as the first electrode wire 42.

The second electrode wire 44 has a two layer structure including a plug portion 44a and a wire portion 44b. In this case, the plug portion 44a is made of a material different from the first electrode wire 42. On the other hand, the wire portion 44b is made of the same material as the first electrode wire 42.

A first organic molecule layer 46 is provided, between the first electrode wire 42 and the second electrode wire 44, at a crossing portion between the first electrode wire 42 and the second electrode wire 44. The first organic molecule layer 46 is constituted by a plurality of resistance change-type molecular chains 16a. The plurality of first organic molecule layers 46 constitutes the first memory cell array.

The first organic molecule layer 46 and the first electrode wire 42 are in contact with each other, and an air gap 20 exists between the first organic molecule layer 46 and the second electrode wire 44.

Insulating layers 22 are formed in spaces between a first organic molecule layer 46 and a first organic molecule layer 46 adjacent to each other, between a first electrode wire 42 and a first electrode wire 42 adjacent to each other, and between a second electrode wire 44 and a second electrode wire 44 adjacent to each other.

Further, a third electrode wire 54 is provided that crosses the second electrode wire 44 and is made of the same material as the first electrode wire 42 which is different from the second electrode wire 44. The third electrode wire 54 has a two layer structure including a plug portion 54a and a wire portion 54b.

A second organic molecule layer 56 is provided, between the second electrode wire 44 and the third electrode wire 54, at a crossing portion between the second electrode wire 44 and the third electrode wire 54. The plurality of resistance change-type molecular chains 16a constitutes the second organic molecule layer 56. The plurality of second organic molecule layers 56 constitutes the second memory cell array.

The second organic molecule layer 56 and the second electrode wire 44 are in contact with each other, and an air gap 20 exists between the second organic molecule layer 56 and the third electrode wire 54.

Insulating layers 22 are formed in spaces between adjacent second organic molecule layers 56 and between third electrode wires 54.

The organic molecular memory according to the present embodiment can be manufactured by repeating the manufacturing method of the second embodiment by changing the electrode material.

Like the second embodiment, according to the present embodiment, two layers of cell arrays are stacked, so that the memory capacity of the molecular memory can be increased. In this explanation, for example, two layers of cell arrays are stacked. However, the memory capacity can be further increased by laminating three layers of cell arrays or more.

In addition, the resistance change-type molecular chains constituting the organic molecule layers are in the same direction in the first cell array and the second cell array, and this configuration eliminates difference of characteristics in the molecular cells in the first cell array and the second cell array.

Fourth Embodiment

An organic molecular memory according to the present embodiment is basically the same as the first embodiment except that a diode device is formed between an organic molecule layer and an electrode wire. Therefore, descriptions about the same contents as the first embodiment are omitted.

Figure 18A:
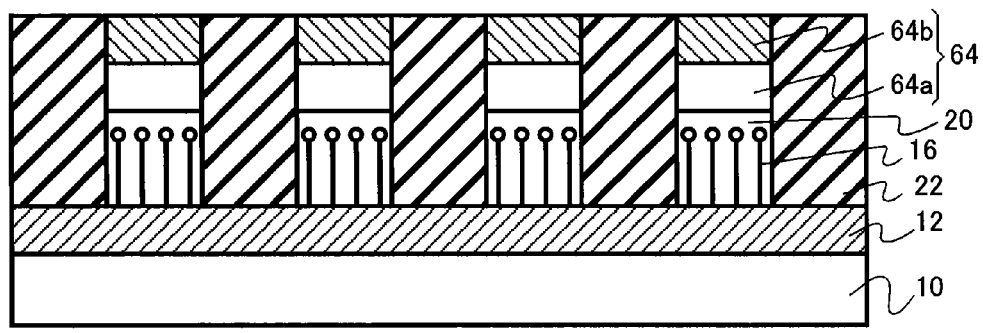
FIGS. 18A to 18C are schematic cross sectional views and a schematic circuit diagram of an organic molecular memory according to a fourth embodiment.
Figure 18B:
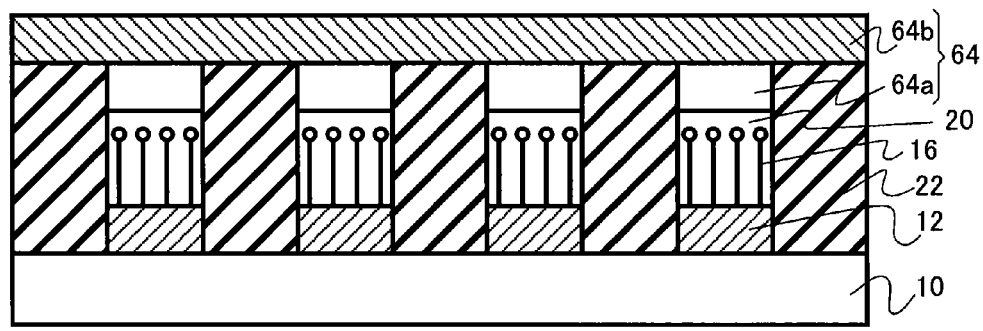
Figure 18C:
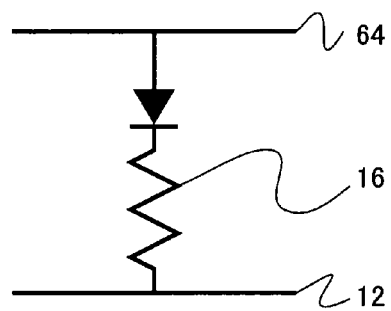

FIGS. 18A and 18B are schematic cross sectional views illustrating the molecular memory according to the present embodiment. FIG. 18B is a figure corresponding to a direction perpendicular to FIG. 18A. FIG. 18C is schematic circuit diagram illustrating a memory cell portion.

The molecular memory according to the present embodiment is a cross point-type molecular memory. As shown in FIGS. 18A and 18B, a plurality of lower electrode wires (first electrode wires) 12 are provided on an upper portion of a substrate 10. A plurality of upper electrode wires (second electrode wires) 64 that are made of a material different from the lower electrode wires 12 are provided to cross the lower electrode wires 12. In FIG. 3, the upper electrode wires 64 are perpendicular to the lower electrode wires 12.

The upper electrode wire 64 has a two layer structure including a plug portion 64a and a wire portion 64b. A diode having rectifying characteristics is formed by the plug portion 64a and the wire portion 64b.

An organic molecule layer 16 is provided, between the lower electrode wire 12 and the upper electrode wire 64, at a crossing portion between the lower electrode wire 12 and the upper electrode wire 64. The organic molecule layer 16 is constituted by a plurality of resistance change-type molecular chains 16a.

The organic molecule layer 16 and the lower electrode wire 12 are in contact with each other, and an air gap 20 exists between the organic molecule layer 16 and the upper electrode wire 64.

Insulating layers 22 are formed in spaces between an organic molecule layer 16 and an organic molecule layer 16 adjacent to each other, between a lower electrode wire 12 and a lower electrode wire 12 adjacent to each other, and between an upper electrode wire 64 and an upper electrode wire 64 adjacent to each other.

The substrate 10 is, for example, silicon in which (110) plane is a surface. The lower electrode wire 12 is, for example, gold (Au), i.e., metallic material.

The plug portion 64a of the upper electrode wire 64 is, for example, silicon doped in n-type. The wire portion 64b is molybdenum (Mo), i.e., metallic material. The insulating layer 22 is, for example, a silicon nitride film.

The resistance change-type molecular chain 16a constituting the organic molecule layer 16 is, for example, 4-[2-amino-5-nitro-4-(phenylethynyl)phenylethynyl]benzenethiol as shown in FIG. 2.

According to the present embodiment, Schottky barrier is formed by the molybdenum (Mo) of the wire portion 64b and the silicon of the plug portion 64a of the upper electrode wire 64. Therefore, as shown in FIG. 18C, a Schottky diode is formed between the organic molecule layer 16 and the upper electrode wire 64.

The Schottky diode rectifies the current flowing between the upper electrode wire 64 and the lower electrode wire 12. Therefore, even when the resistance change-type molecular chain 16a itself forming the organic molecule layer 16 does not have any diode characteristic or does not have sufficient diode characteristic, the Schottky diode suppresses a leak current in an unselected cell. Therefore, the organic molecular memory achieving stable operation can be achieved.

Fifth Embodiment

An organic molecular memory according to the present embodiment includes a first electrode, a second electrode made of a material different from the first electrode, and an organic molecule layer provided between the first electrode and the second electrode. One end of the resistance change-type molecular chain constituting the organic molecule layer is chemically bonded with the first electrode, and an air gap exists between the other end of the resistance change-type molecular chain and the second electrode.

The organic molecular memory according to the present embodiment is an organic molecular memory in which one transistor and one organic molecule layer are used as a memory cell. The organic molecular memory according to the present embodiment is basically the same as the first embodiment except the memory cell structure. Therefore, descriptions about the same contents as the first embodiment are omitted.

Figure 19:
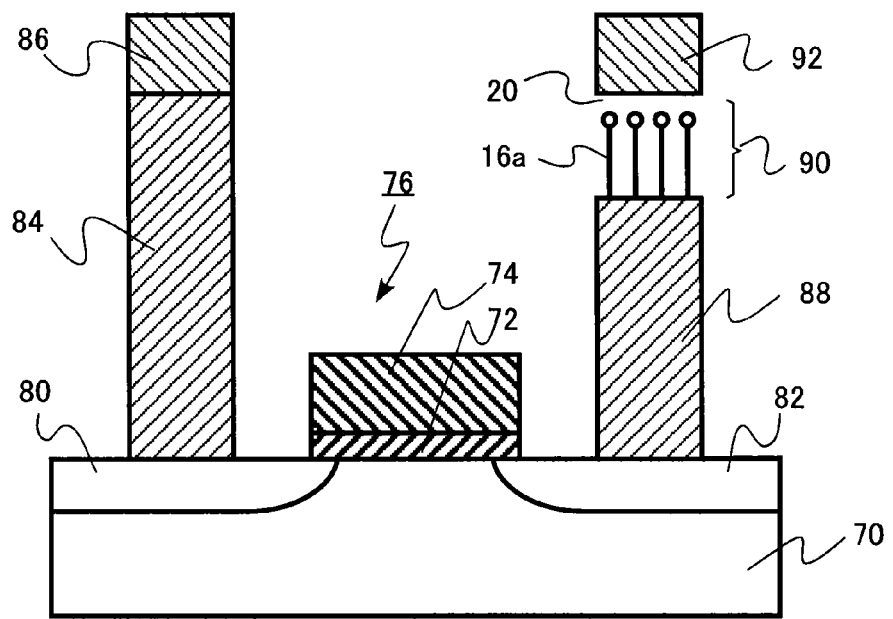
FIG. 19 is a schematic cross sectional view illustrating a memory cell unit of an organic molecular memory according to a fifth embodiment.

FIG. 19 is a schematic cross sectional view illustrating a memory cell unit of the molecular memory according to the present embodiment.

The organic molecular memory according to the present embodiment is a molecular memory in which one transistor and one resistance change-type organic molecule layer are used as a memory cell. As shown in FIG. 19, a selection transistor 76 including a gate insulating film 72 and a gate electrode 74 is formed on a substrate 70. A first source/drain region 80 and a second source/drain region 82 are formed in the substrate 70 with the gate electrode 74 interposed therebetween.

The substrate 70 is, for example, a silicon substrate. The gate insulating film 72 is, for example, a silicon oxide film. The gate electrode 74 is, for example, polycrystalline silicon. The first source/drain region 80 and the second source/drain region 82 are diffusion layers using, e.g., arsenic (As) as impurity.

A first contact plug 84 is formed on the first source/drain region 80. Then, a first bit line 86 is formed on the first contact plug 84. The material of the first contact plug 84 is, for example, tungsten, and the material of the first bit line 86 is, for example, molybdenum.

A second contact plug (first electrode) 88 is formed on the second source/drain region 82. Then, a second bit line (second electrode) 92 is formed on the second contact plug 88 with a organic molecule layer 90 interposed therebetween. The material of the second contact plug 88 is, for example, tungsten, and the material of the second bit line 92 is, for example, molybdenum. The material of the second bit line 92 is made of a material different from the second contact plug 88.

The organic molecule layer 90 is constituted by a plurality of resistance change-type molecular chains 16a. The organic molecule layer 90 and second contact plug 88 are in contact with each other, and an air gap 20 exists between the organic molecule layer 90 and second bit line 92. More specifically, one end of the resistance change-type molecular chain 16a constituting the organic molecule layer 90 is chemically bonded with the second contact plug 88, and the air gap 20 exists between the other end thereof and the second bit line 92.

The resistance change-type molecular chain 16a constituting the organic molecule layer 90 is, for example, 4-[2-amino-5-nitro-4-(phenylethynyl)phenylethynyl]benzenethiol as shown in FIG. 2.

The resistance change-type molecular chain 16a is a molecular chain having function of changing resistance in response to presence/absence of electric field and injection of charge. For example, the resistance change-type molecular chain having the molecular structure as shown in FIG. 2 can switch between low resistance state and high resistance state when a voltage is applied between both end portions.

In the organic molecular memory according to the present embodiment, a voltage is applied between the first bit line 86 and second bit line 92 while the selection transistor 76 is turned on, so that writing and erasing to/from the organic molecule layer 90 is enabled. On the other hand, the resistance state of the organic molecule layer 90 can be read by monitoring the current flowing between the first bit line 86 and the second bit line 92 while the selection transistor 76 is turned on. The memory cell operates with these operations.

Like the first embodiment, the air gap width is desirably 0.2 nm or more, and is more desirably 0.5 nm or more. The preferable materials of the second contact plug (first electrode) 88 and the second bit line (second electrode) 92 sandwiching the organic molecule layer 90 are the same as those listed in the first embodiment.

Like the first embodiment, the present embodiment reduces the electric current flowing through the organic molecule layer of the molecular memory. Therefore, this can prevent wires from breaking due to migration caused by flow of excessive current. When the leak current is reduced in an unselected cell, malfunction of the memory can be prevented.

The embodiments of the present invention have been hereinabove explained with reference to specific examples. The above embodiments are shown merely as examples, and are not intended to limit the present invention. Description about portions of the organic molecular memory, the method of manufacturing the organic molecular memory, and the like that are not directly needed in the explanation about the present invention is omitted in the explanation about the embodiments. However, necessary elements related to the organic molecular memory, the method of manufacturing the organic molecular memory, and the like can be selected and used as necessary.

For example, in the embodiments, only the resistance change-type molecular chain is mentioned as the organic molecule constituting the organic molecule layer. However, this does not exclude the possibility that not only the resistance change-type molecular chain but also other organic molecules are included in the organic molecule layer.

In addition, all semiconductor rectifying apparatuses that have the elements of the present invention and can be made by a person skilled in the art through design change applied as necessary are included in the scope of the present invention. The scope of the present invention is defined by claims and the scope equivalent thereto.

What is claimed is:

1. An organic molecular memory comprising:
   a first electrode;
   a second electrode; and
   a first organic molecule layer provided between the first electrode and the second electrode, and having a resistance change-type molecular chain,
   wherein one end of the first resistance change-type molecular chain closer to the first electrode is a thiol group, a region of the first electrode facing the second electrode includes a material selected from a first group consisting of gold (Au), silver (Ag), copper (Cu), tungsten (W), tungsten nitride (WN), tantalum nitride (TaN), and titanium nitride (TiN), and a region of the second electrode facing the first electrode includes a material selected from a second group consisting of tantalum (Ta), molybdenum (Mo), molybdenum nitride (MoN), and silicon (Si).

2. The organic molecular memory according to claim 1, wherein the first organic molecule layer and the second electrode has a distance.

3. The organic molecular memory according to claim 1, wherein an air gap exists between the first organic molecule layer and the second electrode.

4. The organic molecular memory according to claim 1 further comprising:
   a first electrode wire including the first electrode; and
   a second electrode wire including the second electrode, the second electrode wire crossing the first electrode wire,
   wherein the first electrode and the second electrode provided at a crossing portion of the first electrode wire and the second electrode wire.

5. The organic molecular memory according to claim 1 further comprising:
   a first electrode wire including the first electrode;
   a second electrode wire including the second electrode, the second electrode wire crossing the first electrode wire; and
   a diode provided between the first organic molecule layer and the second electrode wire,
   wherein the first electrode and the second electrode provided at a crossing portion of the first electrode wire and the second electrode wire.

6. The organic molecular memory according to claim 1 further comprising:
   a third electrode;
   a fourth electrode;
   a second organic molecule layer provided between the third electrode and the fourth electrode, and having a second resistance change-type molecular chain, one end of the second resistance change-type molecular chain closer to the third electrode being a thiol group;
   a first electrode wire including the first electrode;
   a second electrode wire including the second electrode and the fourth electrode, the second electrode wire crossing the first electrode wire; and
   a third electrode wire including the third electrode, the third electrode wire crossing the second electrode wire,
   wherein the first electrode and the second electrode provided at a crossing portion of the first electrode wire and the second electrode wire,
   wherein the third electrode and the fourth electrode provided at a crossing portion of the second electrode wire and the third electrode wire, wherein a region of the third electrode facing the fourth electrode is made of a same material as the region of the first electrode facing the second electrode, and a region of the fourth electrode facing the third electrode is made of a same material as the region of the second electrode facing the first electrode.

7. The organic molecular memory according to claim 1 further comprising:
a third electrode;
a fourth electrode;
a second organic molecule layer provided between the third electrode and the fourth electrode, and having a second resistance change-type molecular chain, one end of the second resistance change-type molecular chain closer to the third electrode being a thiol group;
a first electrode wire including the first electrode;
a second electrode wire including the second electrode and the third electrode, the second electrode wire crossing the first electrode wire; and
a third electrode wire including the fourth electrode, the third electrode wire crossing the second electrode wire,
wherein the first electrode and the second electrode provided at a crossing portion of the first electrode wire and the second electrode wire,
wherein the third electrode and the fourth electrode provided at a crossing portion of the second electrode wire and the third electrode wire,
wherein a region of the third electrode facing the fourth electrode is made of a same material as the region of the first electrode facing the second electrode, and a region of the fourth electrode facing the third electrode is made of a same material as the region of the second electrode facing the first electrode.

8. The organic molecular memory according to claim 1 further comprising:
a transistor including a first source/drain region, a second source/drain region and a gate electrode, the gate electrode being interposed between the first source/drain region and the second source/drain region;
a first wire connected to the first source/drain region; and
a second wire including the second electrode,
wherein the first electrode connected to the second source/drain region.

9. The organic molecular memory according to claim 2, wherein the distance is 0.2 nm or more and 50 nm or less.

10. An organic molecular memory comprising:
a first electrode;
a second electrode; and
a first organic molecule layer provided between the first electrode and the second electrode, and having a first resistance change-type molecular chain,
wherein one end of the first resistance change-type molecular chain closer to the first electrode is an alcohol group or a carboxyl group, a region of the first electrode facing the second electrode includes a material selected from a first group consisting of tungsten (W), tungsten nitride (WN), tantalum (Ta), tantalum nitride (TaN), molybdenum (Mo), molybdenum nitride (MoN), and titanium nitride (TiN), and a region of the second electrode facing the first electrode includes a material selected from a second group consisting of gold(Au), silver (Ag), copper (Cu), and silicon (Si).

11. The organic molecular memory according to claim 10, wherein the first organic molecule layer and the second electrode has a distance.

12. The organic molecular memory according to claim 10, wherein an air gap exists between the first organic molecule layer and the second electrode.

13. The organic molecular memory according to claim 10 further comprising:
a first electrode wire including the first electrode; and
a second electrode wire including the second electrode, the second electrode wire crossing the first electrode wire,
wherein the first electrode and the second electrode provided at a crossing portion of the first electrode wire and the second electrode wire.

14. The organic molecular memory according to claim 10 further comprising:
a first electrode wire including the first electrode;
a second electrode wire including the second electrode, the second electrode wire crossing the first electrode wire; and
a diode provided between the first organic molecule layer and the second electrode wire,
wherein the first electrode and the second electrode provided at a crossing portion of the first electrode wire and the second electrode wire.

15. The organic molecular memory according to claim 10 further comprising:
a third electrode;
a fourth electrode;
a second organic molecule layer provided between the third electrode and the fourth electrode, and having a second resistance change-type molecular chain, one end of the second resistance change-type molecular chain closer to the third electrode being an alcohol group or a carboxyl group;
a first electrode wire including the first electrode;
a second electrode wire including the second electrode and the fourth electrode, the second electrode wire crossing the first electrode wire; and
a third electrode wire including the third electrode, the third electrode wire crossing the second electrode wire,
wherein the first electrode and the second electrode provided at a crossing portion of the first electrode wire and the second electrode wire,
wherein the third electrode and the fourth electrode provided at a crossing portion of the second electrode wire and the third electrode wire,
wherein a region of the third electrode facing the fourth electrode is made of a same material as the region of the first electrode facing the second electrode, and a region of the fourth electrode facing the third electrode is made of a same material as the region of the second electrode facing the first electrode.

16. The organic molecular memory according to claim 10 further comprising:
a third electrode;
a fourth electrode;
a second organic molecule layer provided between the third electrode and the fourth electrode, and having a second resistance change-type molecular chain, one end of the second resistance change-type molecular chain closer to the third electrode being an alcohol group or a carboxyl group;
a first electrode wire including the first electrode;
a second electrode wire including the second electrode and the third electrode, the second electrode wire crossing the first electrode wire; and
a third electrode wire including the fourth electrode, the third electrode wire crossing the second electrode wire, wherein the first electrode and the second electrode provided at a crossing portion of the first electrode wire and the second electrode wire, wherein the third electrode and the fourth electrode provided at a crossing portion of the second electrode wire and the third electrode wire, wherein a region of the third electrode facing the fourth electrode is made of a same material as the region of the first electrode facing the second electrode, and a region of the fourth electrode facing the third electrode is made of a same material as the region of the second electrode facing the first electrode.

17. The organic molecular memory according to claim 10 further comprising:
a transistor including a first source/drain region, a second source/drain region and a gate electrode, the gate electrode being interposed between the first source/drain region and the second source/drain region;
a first wire connected to the first source/drain region; and
a second wire including the second electrode,
wherein the first electrode connected to the second source/drain region.

18. The organic molecular memory according to claim 11, wherein the distance is 0.2 nm or more and 50 nm or less.

19. An organic molecular memory comprising:
a first electrode;
a second electrode; and
a first organic molecule layer provided between the first electrode and the second electrode, and having a first resistance change-type molecular chain,
wherein one end of the first resistance change-type molecular chain closer to the first electrode is a silanol group, a region of the first electrode facing the second electrode includes a material selected from a first group consisting of silicon (Si) and metal oxide, and a region of the second electrode facing the first electrode includes a material selected from a second group consisting of gold(Au), silver (Ag), copper (Cu), tungsten (W), tungsten nitride (WN), tantalum (Ta), tantalum nitride (TaN), molybdenum (Mo), molybdenum nitride (MoN), and titanium nitride (TiN).

20. The organic molecular memory according to claim 19, wherein the first organic molecule layer and the second electrode has a distance.

21. The organic molecular memory according to claim 19, wherein an air gap exists between the first organic molecule layer and the second electrode.

22. The organic molecular memory according to claim 19 further comprising:
a first electrode wire including the first electrode; and
a second electrode wire including the second electrode, the second electrode wire crossing the first electrode wire,
wherein the first electrode and the second electrode provided at a crossing portion of the first electrode wire and the second electrode wire.

23. The organic molecular memory according to claim 19 further comprising:
a first electrode wire including the first electrode;
a second electrode wire including the second electrode, the second electrode wire crossing the first electrode wire; and
a diode provided between the first organic molecule layer and the second electrode wire, wherein the first electrode and the second electrode provided at a crossing portion of the first electrode wire and the second electrode wire.

24. The organic molecular memory according to claim 19 further comprising:
a third electrode;
a fourth electrode;
a second organic molecule layer provided between the third electrode and the fourth electrode, and having a second resistance change-type molecular chain, one end of the second resistance change-type molecular chain closer to the third electrode being a silanol group;
a first electrode wire including the first electrode;
a second electrode wire including the second electrode and the fourth electrode, the second electrode wire crossing the first electrode wire; and
a third electrode wire including the third electrode, the third electrode wire crossing the second electrode wire,
wherein the first electrode and the second electrode provided at a crossing portion of the first electrode wire and the second electrode wire,
wherein the third electrode and the fourth electrode provided at a crossing portion of the second electrode wire and the third electrode wire,
wherein a region of the third electrode facing the fourth electrode is made of a same material as the region of the first electrode facing the second electrode, and a region of the fourth electrode facing the third electrode is made of a same material as the region of the second electrode facing the first electrode.

25. The organic molecular memory according to claim 19 further comprising:
a third electrode;
a fourth electrode;
a second organic molecule layer provided between the third electrode and the fourth electrode, and having a second resistance change-type molecular chain, one end of the second resistance change-type molecular chain closer to the third electrode being a silanol group;
a first electrode wire including the first electrode;
a second electrode wire including the second electrode and the third electrode, the second electrode wire crossing the first electrode wire; and
a third electrode wire including the fourth electrode, the third electrode wire crossing the second electrode wire,
wherein the first electrode and the second electrode provided at a crossing portion of the first electrode wire and the second electrode wire,
wherein the third electrode and the fourth electrode provided at a crossing portion of the second electrode wire and the third electrode wire,
wherein a region of the third electrode facing the fourth electrode is made of a same material as the region of the first electrode facing the second electrode, and a region of the fourth electrode facing the third electrode is made of a same material as the region of the second electrode facing the first electrode.

26. The organic molecular memory according to claim 19 further comprising:
a transistor including a first source/drain region, a second source/drain region and a gate electrode, the gate electrode being interposed between the first source/drain region and the second source/drain region;

a first wire connected to the first source/drain region; and
a second wire including the second electrode, wherein the first electrode connected to the second source/drain region.

27. The organic molecular memory according to claim 20, wherein the distance is 0.2 nm or more and 50 nm or less.

* * * * *